United States Patent [19]

Hertel

[11] Patent Number: 4,634,331
[45] Date of Patent: Jan. 6, 1987

[54] WAFER TRANSFER SYSTEM

[75] Inventor: Richard J. Hertel, Bradford, Mass.

[73] Assignee: Varian Associates, Inc., Palo Alto, Calif.

[21] Appl. No.: 680,202

[22] Filed: Dec. 10, 1984

Related U.S. Application Data

[62] Division of Ser. No. 381,286, May 24, 1982, Pat. No. 4,498,833.

[51] Int. Cl.$^4$ .................... B65G 1/00; C23C 14/00
[52] U.S. Cl. ................................ 414/217; 110/180; 118/724; 118/728; 118/733; 204/298; 414/225; 432/237
[58] Field of Search ............... 414/217, 222, 225, 226, 414/416, 417; 432/237; 110/180; 118/724, 728, 729, 733, 500; 204/298

[56] References Cited

U.S. PATENT DOCUMENTS

| | | | |
|---|---|---|---|
| 3,340,176 | 9/1967 | Belluso et al. | 414/217 X |
| 3,521,765 | 7/1970 | Kauffman et al. | 414/217 |
| 3,649,512 | 3/1972 | Ackley | 204/298 |
| 3,981,791 | 9/1976 | Rosvold | 118/733 X |
| 4,047,624 | 9/1977 | Dorenbos | 414/217 X |
| 4,261,762 | 4/1981 | King | 118/728 X |
| 4,282,924 | 8/1981 | Faretra | 204/298 X |
| 4,306,731 | 12/1981 | Shaw | 279/4 |
| 4,311,427 | 1/1982 | Coad et al. | 414/217 |
| 4,412,771 | 11/1983 | Gerlach et al. | 414/222 X |
| 4,416,755 | 11/1983 | Ceasar et al. | 204/298 X |

FOREIGN PATENT DOCUMENTS 2066300 12/1980 United Kingdom .

OTHER PUBLICATIONS

IBM Technical Disclosure Bulletin, vol. 19, No. 6, Nov. 1976, pp. 2270-2271, Hammer, "Cooling Ion-Implantation Target".
IBM Technical Disclosure Bulletin, vol. 22, No. 2, Jul. 1979, pp. 550-554, Carbone et al, "Ultra-High Vacuum Evaporation/Sputtering Apparatus for Cryogenic Thin Film Technology".
Industrial Research & Dev., Mar. 81, F. T. Turner & M. Hutchinson "Individual Wafer Metallizing System-A Case History".
Industrial Research & Dev., Apr. 1981, F. T. Turner & M. Hutchinson "Individual Wafer Metallying System-A Case History, Part 2".

Primary Examiner—Robert J. Spar
Assistant Examiner—David A. Bucci
Attorney, Agent, or Firm—Stanley Z. Cole; W. R. McClellan; L. F. Herbert

[57] ABSTRACT

Apparatus for programmably orienting a semiconductor wafer in an ion implantation system so as to limit channeling and to control the depth of penetration of impinging ions. The apparatus is associated with a processing chamber door and includes a rotatable vacuum chuck for engaging the wafer and a motor for rotating the vacuum chuck and the wafer through a preselected angular displacement. The apparatus further includes a programmable control assembly operative to deenergize the motor upon sensing rotation of the vacuum chuck through the preselected angular displacement. The wafer orientation apparatus is typically utilized in a system for the vertical transfer of wafers between a cassette and a processing chamber.

6 Claims, 6 Drawing Figures

WAFER TRANSFER SYSTEM

REFERENCE TO RELATED APPLICATION

This application is a division of pending application Ser. No. 381,286, filed May 24, 1982, now U.S. Pat. No. 4,498,833.

BACKGROUND OF THE INVENTION

This invention relates to processing of semiconductor wafers and, more particularly, relates to a wafer handling system including apparatus for providing individual wafers with a preselected orientation relative to a treatment beam.

Ion implantation has become a standard technique for introducing impurities into semiconductor wafers in a controlled and rapid manner. A beam of ions is generated in a source and directed with varying degrees of acceleration toward the semiconductor wafer. The impurities are introduced into the bulk of semiconductor wafers by using the momentum of the ions as a means of embedding them in the crystalline lattice of the semiconductor material. In bombarding the semiconductor material, it is desirable to carefully control the depth of penetration of the impurity ions so as to control the characteristics of the semiconductor device being fabricated. One factor which determines depth of penetration is the kinetic energy of the impinging ions.

Another factor determinative of depth of penetration is the angle at which the ion beam impinges on the crystalline structure of the semiconductor material, typically silicon. For certain angles of incidence of the ion beam upon the crystalline lattice, it is known that an increase in depth of penetration, referred to as channeling, occurs. The channeling effect arises because rows or planes of atoms can steer energetic ions by means of a correlated series of gentle, small-angle collisions. Since silicon semiconductor wafers are typically cut with a particular crystal axis normal to the surface, it has been the practice in ion implantation to tilt the wafer with respect to the ion beam to avoid channeling effects. Typically, the wafer is tilted so as to provide an angle of about 7 degrees between the ion beam and the normal to the wafer. However, when the wafer is tilted, channeling occurs for certain angles of rotation of the wafer due to rotation of various crystal planes into alignment with the incident ion beam. See, for example, Chu et al, "Backscattering Spectrometry," Academic Press, New York, 1978, pp. 227–228. Therefore, in order to have complete control over the depth of penetration of implanted ions, it is necessary not only to tilt the semiconductor wafer but also to provide a rotational orientation for which channeling is minimal.

One of the major objectives in commercial semiconductor processing is to achieve a high throughput in terms of wafers processed per unit time. To assist in achieving high throughput, automated wafer transfer systems have been developed. These systems typically transfer wafers from a wafer carrier, or cassette, into a wafer processing chamber and then back into the cassette without intervention by an operator. See, for example, U.S. Pat. No. 4,311,427, issued Jan. 19, 1982, to Coad et al, which discloses an automated wafer transfer system for a sputtering system. The wafers in the cassette normally have an unknown rotational orientation when the cassette is introduced into the system. It is therefore desirable to provide such wafer transfer systems with the capability of rotating the wafers into a preselected orientation prior to processing in order to avoid the above-described effects of channeling. It is further desirable that an apparatus for orienting wafers should be simple, low cost, accurate, and fast acting in order to avoid an adverse impact upon the speed and cost of processing wafers.

Apparatus for wafer orientation have been shown in the prior art. U.S. Pat. No. 4,311,427 discloses the use of rotating rollers for aligning the guide flats of wafers in a cassette. U.S. Pat. No. 3,901,183, issued Aug. 26, 1975, to Wittkower, discloses the use of a rotating disk on a wafer holder in a vacuum chamber for aligning the guide flat of a wafer. However, such systems can only align the flat at one predetermined angle. In some wafer processing steps, this limitation is undesirable. The wafer guide flat is not always indicative of the same semiconductor crystal plane. Therefore, simple flat alignment does not always produce the same angle between the crystal lattice and an ion beam. To provide flexibility, the wafer handling system should be programmable to permit any preselected orientation of the wafer.

A separate wafer orientation station can be provided between the cassette and the wafer processing chamber. However, such an arrangement adds complexity and cost to the wafer transfer system. Furthermore, the speed of the wafer transfer system is reduced and the risk of wafer damage or breakage is increased when an additional wafer transfer step is introduced. Finally, errors in wafer orientation can arise as the wafer is transferred from the orientation station to the processing chamber.

It is a general object of the present invention to provide apparatus for orienting a semiconductor wafer prior to processing in a wafer processing chamber.

It is another object of the present invention to provide a simple apparatus for rotating a semiconductor wafer through any preselected angular displacement.

It is yet another object of the present invention to provide apparatus for orienting a semiconductor wafer in an automated wafer transfer system.

It is still another object of the present invention to provide apparatus for orienting a semiconductor wafer at an entrance to a semiconductor processing chamber.

SUMMARY OF THE INVENTION

According to the present invention, these and other objects and advantages are achieved in apparatus for positioning a generally circular wafer in a wafer processing chamber prior to processing. The apparatus comprises wafer handling means associated with an entrance to the wafer processing chamber for receiving the wafers and moving the wafers into the processing chamber, means associated with the wafer handling means for engaging the wafer and rotating same through any preselected angular displacement and means for delivering the wafer to the wafer handling means.

According to another aspect of the present invention, a system for the automated transfer of generally circular wafers, one at a time, between a cassette holding a plurality of wafers and a wafer processing chamber includes apparatus for providing each of the wafers with any preselected orientation prior to processing. The apparatus comprises wafer handling means associated with an entrance to the wafer processing chamber for receiving a wafer and moving the wafer into the processing chamber. The wafer handling means includes means for engaging the wafer and rotating same through a preselected angular displacement. The apparatus further comprises transfer means for transporting the wafer between the cassette and the wafer handling means and cassette conveyor means for positioning the cassette relative to the transfer means. The apparatus still further comprises means for prealigning a guide flat on each of the plurality of wafers in the cassette.

BRIEF DESCRIPTION OF THE DRAWINGS

For a better understanding of the present invention, together with other and further objects, advantages and capabilities thereof, reference may be had to the accompanying drawings which are incorporated herein by reference and in which.

DETAILED DESCRIPTION OF THE INVENTION

Figure 1:
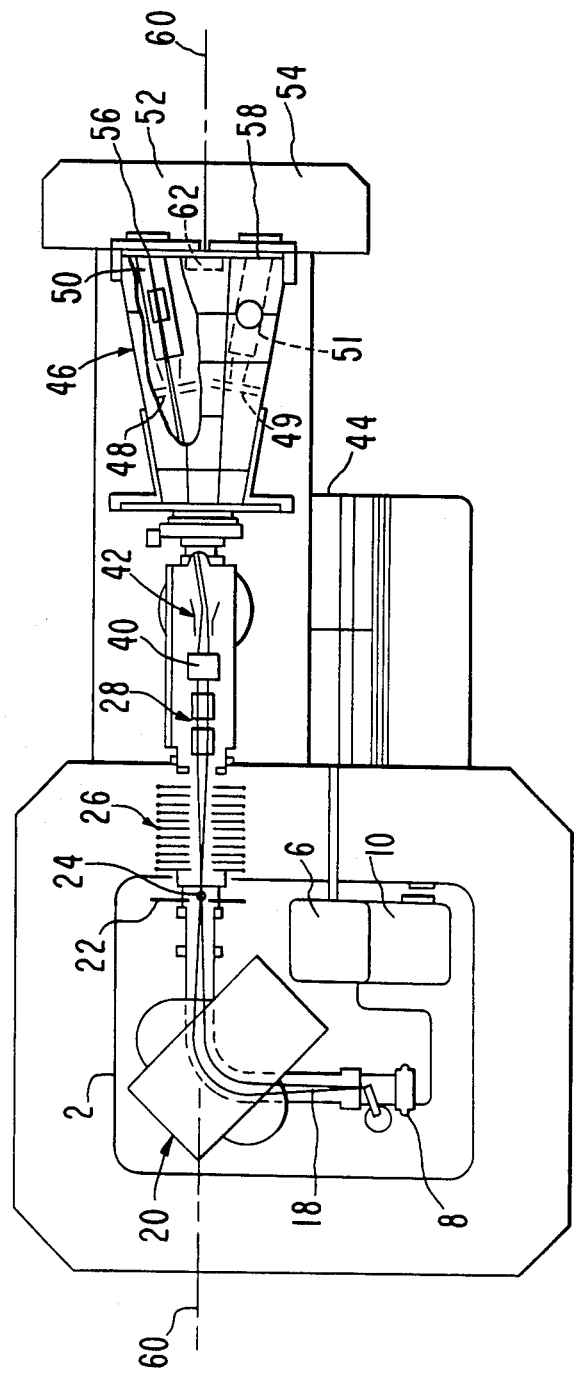
FIG. 1 is a schematic diagram, viewed from above, of an ion implantation system.

The wafer orientation system according to the present invention is typically used in an ion implantation system. An example of an ion implantation system is illustrated in FIG. 1. A high voltage terminal 2 is held at high potential relative to ground by a high voltage power supply (not shown). The terminal 2 houses the apparatus required to form a beam of ions of desired species. In common practice, a gaseous feed stock of the desired species is employed. A source gas produced from a gas handling system 6 is directed to an ion source 8 which is powered by a power supply 10 and provides a high current ion beam 18. Ion source techniques are generally known in the art. The ion beam 18 diverging from the ion source 8 is mass analyzed and focused by an analyzer magnet 20. The analyzed beam passes through a resolving aperture 22 and a variable slit 24 and then through an acceleration tube 26 where it encounters a carefully designed field gradient from the high voltage terminal 2 to ground potential. Optical elements such as a quadrupole lens 28 operate to produce a spatial energy focus at a target plane. Y deflection plates 40 and X deflection plates 42 provide electrostatic deflection which directs the beam 18 over the area of the target plane. The waveforms applied to the respective deflection plates to form the desired scanning pattern are provided by a scanning system 44.

A dual target, chamber 46 includes a housing, beam defining masks 48, 49 and Faraday cages 50, 51 for beam monitoring. Automatic wafer transfer systems 52, 54 introduce semiconductor wafers one at a time into the vacuum system in target positions 56, 58, respectively, align the same with respect to the target plane, provide cooling of the wafers during implantation and remove the wafers from the vacuum system after implantation is complete. Target positions 56, 58 are typically located within air locks, as described hereinafter, and are displaced horizontally on opposite sides of the longitudinal axis 60 of the undeflected beam 18 such as to require a beam deflection of about ±7° from the longitudinal axis for scanning thereof. A beam dump 62 is located on the longitudinal axis 60 in the target chamber 46 and intercepts the neutral portion of the ion beam 18.

Figure 2:
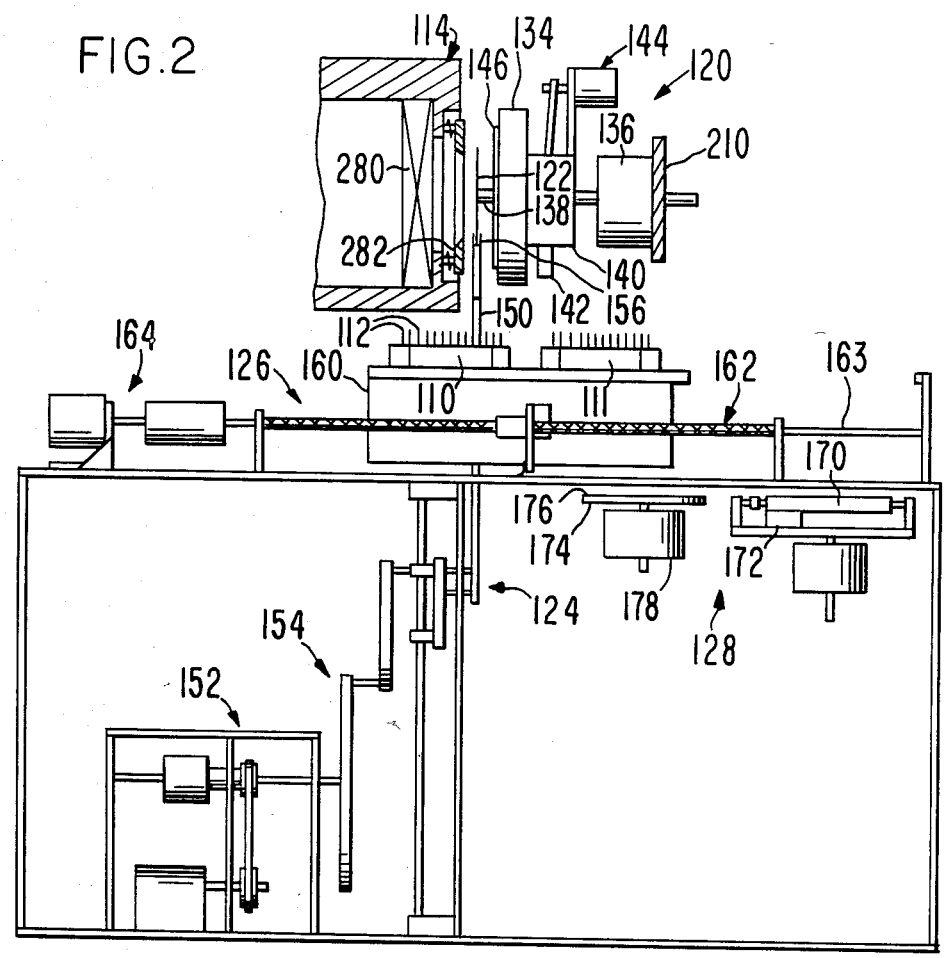
FIG. 2 is a simplified side elevation of an automated wafer transfer system in accordance with the present invention.

An automated wafer transfer system, corresponding to the systems 52, 54 in FIG. 1, is illustrated in simplified form in FIG. 2. The system automatically transfers generally circular semiconductor wafers, one at a time, between cassettes 110, 111, each holding a plurality of wafers 112, and a wafer processing chamber 114. The cassettes 110, 111 each include a plurality of parallel slots for holding the wafers 112 in an upright, parallel position and are used for transporting and temporarily storing the wafers 112. The cassettes 110, 111 are typically a plastic material and, in the system of FIG. 2, must have open bottoms to provide access to the wafers 112 from below. The wafer processing chamber 114 is a vacuum chamber and in the present example is an end station for serial ion implantation of wafers.

The wafer transfer system shown in FIG. 2 includes wafer handing means 120 associated with an entrance to the processing chamber 114 for receiving a wafer 122 and moving the wafer 122 into the processing chamber 114. The transfer system further includes transfer means 124 for transporting the wafer 122 between the cassettes 110, 111 and the wafer handling means 120 and cassette conveyor means 126 for positioning the cassettes 110, 111 relative to the transfer means 124. The system still further includes means 128 for prealigning a guide flat on each of the plurality of wafers 112 in the cassettes 110, 111.

Figure 3:
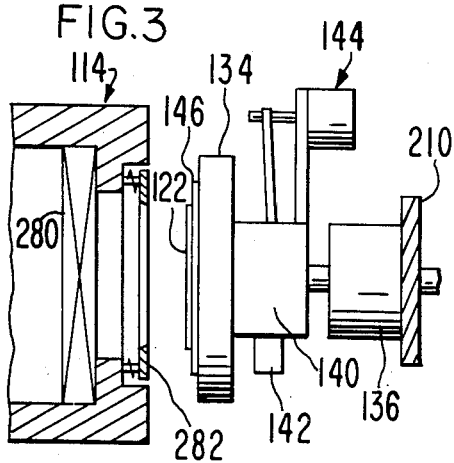
FIG. 3 is a simplified representation of a portion of the system of FIG. 2 shown with the vacuum chuck retracted.
Figure 4:
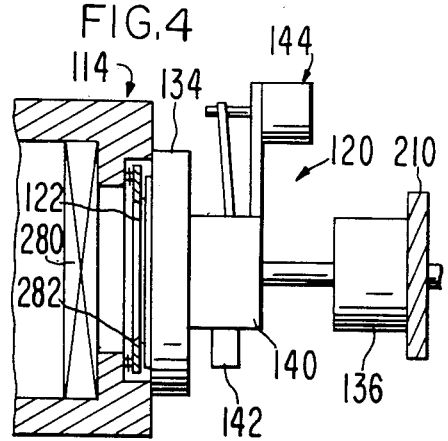
FIG. 4 is a simplified representation of a portion of the system of FIG. 2 shown with the chamber door in the sealed position.

The wafer handling means 120 includes a chamber door 134, means 136 for moving the chamber door 134 between an open position, as shown in FIG. 2, and a sealed position, as shown in FIG. 4, and means for engaging the wafer 122 and rotating it through a preselected angular displacement. The means for engaging the wafer 122 and rotating it includes a rotatable vacuum chuck 138, means enclosed within a housing 140 for moving the vacuum chuck 138 between a wafer-receiving position, as shown in FIG. 2, and a retracted position, as shown in FIG. 3, and means for rotating the vacuum chuck 138 through the preselected angular displacement. The means for rotating the vacuum chuck 138 includes a motor 142 coupled to the vacuum chuck 138 and programmable control means 144 coupled to the vacuum chuck 138, as described in detail hereinafter. The chamber door 134 typically includes a wafer-receiving surface, or platen 146, against which the wafer 122 is held during processing and means (not shown) for cooling the platen 146.

The transfer means 124 includes an elevator blade 150, drive means 152 and crank means 154 coupling the drive means 152 to the elevator blade 150 and converting the rotary motion of the drive means 152 to linear blade 150 motion. The drive means 152 typically includes a motor and a mechanical stepper. The elevator blade 150 has an arcuate leading edge provided with a groove 156 adapted to engage edgewise a wafer in the cassettes 110, 111 from below and raise the wafer to the wafer handling means 120.

The cassette conveyor means 126 includes a cassette holder 160 coupled to a ball reverser 162 positioned on one side and to a guide shaft 163 positioned on the opposite side of the holder 160. The conveyor means 126 further includes drive means 164 for actuating the ball reverser 162 and stepwise or continuously moving the holder 160 along a linear path. The drive means 164 typically includes a motor, a slip clutch and a mechanical stepper.

The means 128 for prealigning the guide flat on each of the wafers 112 includes a roller 170 positioned below the cassettes 110, 111 so as to simultaneously contact the edges of all the wafers 112 in one of the cassettes 110, 111. The roller 170 is in the form of a cylinder which can be rotated by a motor 172 coupled thereto and is movable upward to an alignment position and downward to a retracted position. The axis of the roller 170 is aligned with the long dimension of the cassettes 110, 111. The means 128 for prealigning can further include an element 174 with a flat surface 176 positioned below the cassettes 110, 111. The element 174 is movable upward to an alignment position in which the flat surface 176 contacts the wafers 112 and downward to a retracted position. The element 174 is moved upward and downward by an actuating means 178, such as an air cylinder. For additional information relating to the automated wafer transfer system illustrated in FIG. 2, reference is made to Hertel et al, "Wafer Transfer System," U.S. Ser. No. 381,085, now U.S. Pat. No. 4,449,885.

Figure 5:
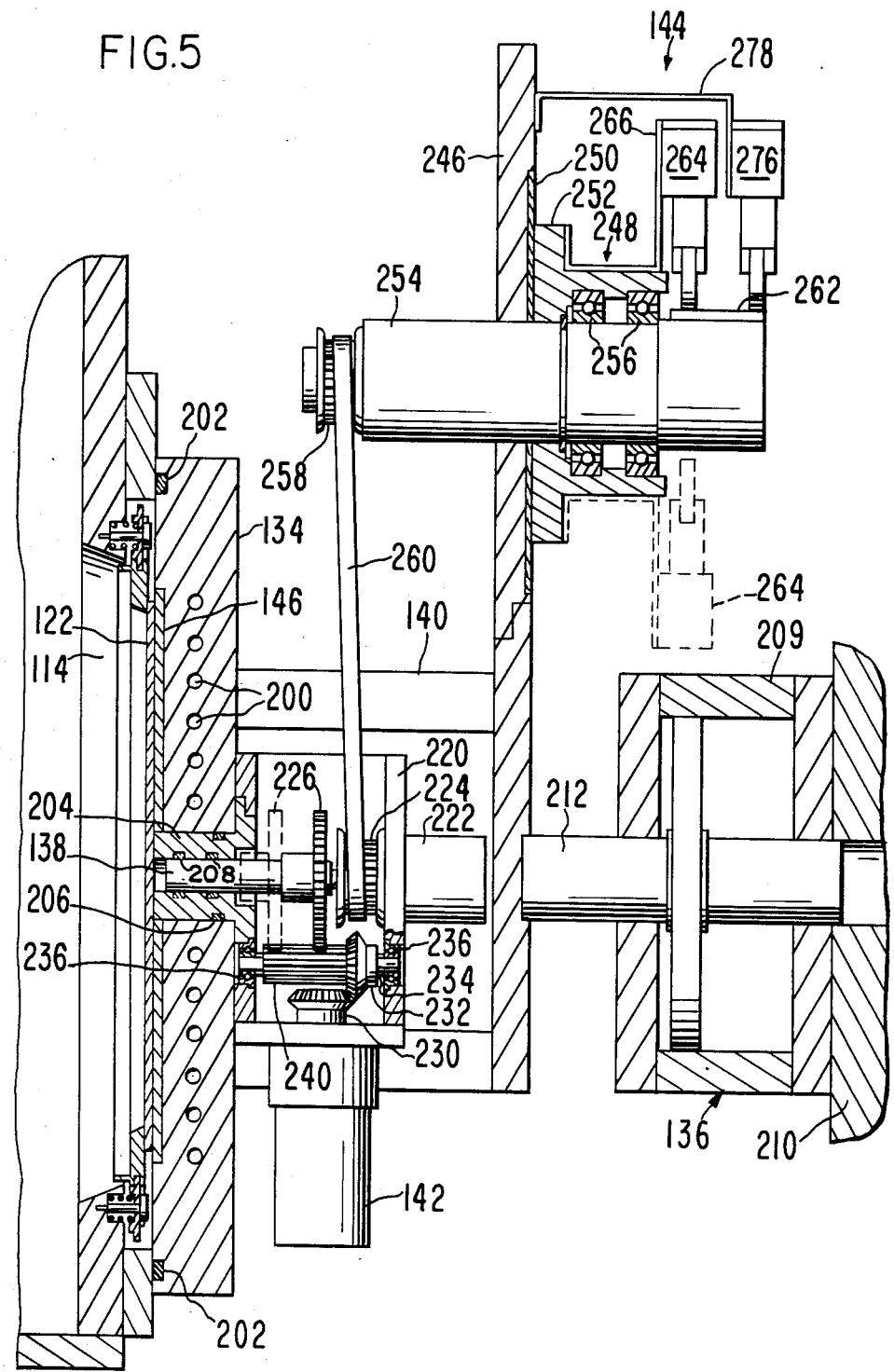
FIG. 5 is a cross-sectional view of the chamber door and the wafer rotation means in accordance with the present invention.

Referring now to FIG. 5, there is shown a cross-sectional view of the wafer handling means 120. The chamber door 134 includes the platen 146 which can be convexly curved and which can be covered with a pliable, thermally conductive material to improve contact between the wafer 122 and the platen 146 as described in U.S. Pat. No. 4,282,924, issued Aug. 11, 1981, to Faretra. Chamber door 134 can also include passages 200 for the circulation of a cooling fluid. An O-ring 202 is provided around the periphery of the chamber door 134 to seal the chamber door against the entrance to the wafer processing chamber 114. The chamber door 134 is further provided with a bushing 204 through which the vacuum chuck 138 passes. The bushing 204 is sealed against the chamber door 134 by an O-ring 206 and against the vacuum chuck 138 by a pair of O-rings 208. The vacuum chuck 138 is a hollow cylinder through which air is drawn to provide suction. The housing 140 is attached to the rear of the chamber door 134. The means 136 for moving the chamber door 134 includes a stationary housing 209 attached to a rigid frame member 210 and a movable member 212 attached to the rear of the housing 140. The means 136 is typically an air cylinder which can be actuated to move the chamber door 134 between the position shown in FIG. 2 and the position shown in FIG. 4.

Alternatively, it will be realized that, in some cases, cooling of the wafer 122 at the chamber door 134 will not be required. For example, the process may not employ high power or the wafer 122 may be transferred away from the chamber door to another position in the processing chamber 114 for processing, as shown in U.S. Pat. No. 4,311,427. In this case, the platen 146 and the cooling passages 200 are not included in the chamber door 134.

A subhousing 220 is mounted to the rear of the chamber door 134 within the housing 140. Means 222 for moving the vacuum chuck 138 between the wafer-receiving position and the retracted position is mounted to the subhousing 220 directly behind the vacuum chuck 138 and can be an air cylinder. Attached to a rotatable shaft of the air cylinder 222 are a timing pulley 224, a spur gear 226 and the vacuum chuck 138. Actuation of the air cylinder 222 provides movement of the vacuum chuck 138 between the wafer-receiving position as shown in FIG. 2 and the retracted position as shown in FIG. 3. The means for rotating the vacuum chuck 138 includes the motor 142 which is attached to the subhousing 220. The motor 142 is typically a reversible DC motor and has attached to its shaft one gear 230 of a mitre gear set. The mating gear 232 of the mitre gear set is mounted on a rotatable shaft 234 positioned at right angles to the shaft of the motor 142 and parallel to the vacuum chuck 138. The shaft 234 is supported by ball bearings sets 236 mounted in the subhousing 220. Also mounted on the shaft 234 is a pinion gear 240 positioned to mesh with the spur gear 226 in both the wafer-receiving position, as indicated by the dotted position of the spur gear 226, and the retracted position of the vacuum chuck 138.

Figure 6:
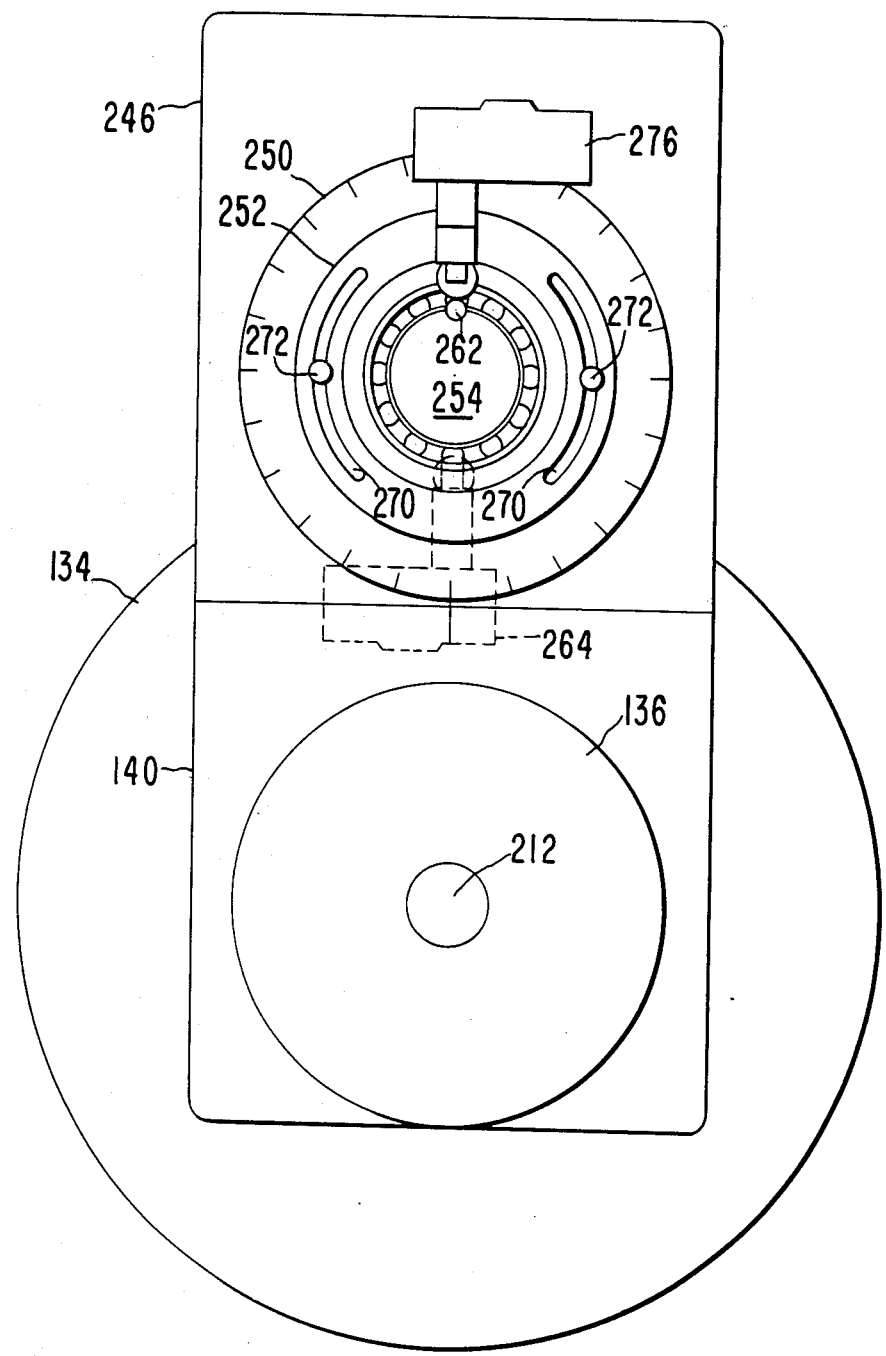
FIG. 6 is a rear elevation view of the chamber door and the wafer rotation means in accordance with the present invention.

Attached to the housing 140 is the programmable control means 144 which is operative to sense the rotation of the vacuum chuck 138 and to control the operation of motor 142. A rear view of the wafer handling means 120, including the programmable control means 144, is shown in FIG. 6. A mounting plate 246 is coupled to the housing 140. Attached to the mounting plate 246 is a selector assembly 248 which includes a dial plate 250 and a selector frame 252. A rotatable shaft 254 is supported in the selector frame 252 by a pair of ball bearings 256. A timing pulley 258 is attached to the shaft 254 and is rotatably coupled to the timing pulley 224 by a timing belt 260. The timing pulleys 224, 258 and the timing belt 260 have teeth which insure that the shaft 254 rotates by the same amount as the vacuum chuck 138. The shaft 254 is provided with a projection 262 at one angular position on its periphery. A switch 264 is mounted to a switch bracket 266 which in turn is attached to the selector frame 252. The switch 264 is mounted so as to be actuated by the projection 262 when the angular positions of the switch 264 and the projection 262 are the same. The dial plate 250 and the selector frame 252 include a pair of arc-shaped slots 270 through which pass bolts 272 for attaching the selector assembly 248 to the mounting plate 246. The arc-shaped slots 270, in combination with a series of holes in the mounting plate 246, permit the entire selector assembly including the switch 264 to be rotated to any preselected angle. The switch 264 is shown by dotted lines in FIGS. 5 and 6 after rotation through 180°. A second switch 276 is supported in a fixed position by a mounting bracket 278 attached to the mounting plate 246. The switch 276 is positioned for actuation by the projection 262 when the angular positions of the switch 276 and the projection 262 are the same. The electrical connections of the switches 264 and 276 are coupled so as to energize and deenergize the motor 142 as described hereinafter.

The operation of the wafer transfer system described hereinabove will be explained with reference to FIGS. 2-6. It will be realized that the automated operation of the wafer transfer system described herein is controlled by a system controller (not shown) which actuates each mechanism at a prescribed time and for a prescribed duration. The controller can be a dedicated electronic controller or can be a computer operating through appropriate interface circuits.

Initially, an operator places cassettes 110, 111 in the cassette holder 160 positioned at the right end (FIG. 2) of the cassette conveyor means 126 and initiates operation of the system. The cassette 110 is moved by operation of the ball reverser 162 and the drive means 164 to a position above the roller 170. The roller 170 is moved upward to the alignment position and is rotated. The rotation of the roller 170 causes rotation of each of the wafers 112 until its guide flat is tangent to the roller 170 at the bottom of the cassette 110. Next, the roller 170 is retracted and the cassette 110 is moved to a position above the element 174 which is then moved upward to the alignment position. The flat surface 176 slightly lifts each of the wafers 112 and then is lowered, thus causing the guide flat of each of the wafers 112 to be accurately positioned at the bottom of the cassette 110. The operation of the element 174 removes minor variations in guide flat alignment remaining after operation of the roller 170.

The cassette 110 is next moved by the cassette conveyor means 126 to a position in which one of the wafers 112 is directly above the elevator blade 150. The blade 150 is raised by operation of the drive means 152 and the crank means 154 until it contacts the wafer 122 from below and engages edgewise the wafer 122 in the groove 156. The blade 150 moves upward through the cassette 110 and lifts the wafer 122 to a position adjacent the open chamber door 134, as shown in FIG. 2. The vacuum chuck 138 is extended outwardly from the chamber door 134 to a wafer-receiving position and holds the wafer 122 through operation of vacuum suction upon the rear surface of the wafer 122. The elevator blade 150 is then lowered. FIG. 2 illustrates the operation at the point when the wafer 122 is transferred to the vacuum chuck 138.

Before the vacuum chuck 138 is retracted or the chamber door 134 is moved to the sealed position, the wafer 122 is rotated to the desired orientation. Since the wafers have been prealigned in the cassette 110, any desired orientation can be obtained by rotating the vacuum chuck 138 through a preselected angular displacement. Referring now to FIG. 6, the operator, before initiating operation of the system, removes the bolts 272, manually rotates the selector assembly 248 to an angle corresponding to the desired angle of rotation of the vacuum chuck 138 and replaces the bolts 272. In the system illustrated in FIG. 6, the initial position of the vacuum chuck 138 and the shaft 254 is with the projection 262 at the top or at twelve o'clock. Thus, if a clockwise rotation of the wafer 122 through an angle of 180° is desired, the selector assembly 248 is rotated by 180° in a clockwise direction and the bolts 272 are tightened. Switch 264 is thus positioned as indicated by dotted lines at an angle of 180° from the initial position of the projection 262.

When the wafer 122 has been received by the vacuum chuck 138, the elevator blade 150 is lowered and the motor 142 is energized and, through the mitre gears 230, 232, rotates the shaft 234. The pinion gear 240 rotates and causes rotation of the spur gear 226, the vacuum chuck 138 and the timing pulley 224. The rotation of the timing pulley 224 is transmitted through the timing belt 260 to the timing pulley 258 and causes rotation of the shaft 254. When the shaft 254 has been rotated by 180°, the projection 262 actuates the switch 264, which is electrically connected so as to deenergize the motor 142 and stop the rotation of the wafer 122. Therefore, the wafer 122 has been rotated by an amount determined by the position of the switch 264.

After orientation of the wafer 122 by rotation of the vacuum chuck 138, the vacuum chuck 138 is retracted into the chamber door, as shown in FIGS. 3 and 5, by operation of the air cylinder 222. By continuous application of vacuum to the vacuum chuck 138, the wafer 122 is held against the platen 146 even after the vacuum chuck 138 has been retracted into the chamber door 134, since the seal is maintained by the O-rings 208. After the vacuum chuck 138 has been retracted, it can be rotated back to its initial position in preparation for receiving the next wafer. The motor 142 is again energized and causes rotation of the vacuum chuck 138 and transmission of the rotation to the shaft 254 as described hereinabove. When the vacuum chuck 138 and the shaft 254 have been rotated back to the initial position, the projection 262 actuates the switch 276 which is electrically connected so as to deenergize the motor 142.

Next, the air cylinder 136 is actuated so as to move the chamber door 134 to the sealed position, as shown in FIGS. 4 and 5. The O-ring 202 provides sealing of the wafer processing chamber 114. An air lock adjacent to the chamber door 134 is typically isolated from the main volume of the processing chamber by a vacuum gate valve 280 when the chamber door 134 is opened. The air lock minimizes the volume required to be vacuum pumped after the chamber door 134 is sealed. After the chamber door 134 is sealed, the air lock is evacuated, the vacuum gate valve 280 is opened and processing of the wafer proceeds. The wafer 122 is firmly clamped around its periphery against the platen 146 by a spring-loaded wafer clamping ring 282. Peripheral clamping of the wafer 122 insures good thermal contact between the wafer 122 and the platen 146. In the present example, the processing of the wafer 122 involves scanning of a focused ion beam over the wafer surface in a uniform, repetitive pattern to provide a prescribed uniform dosage of impurities in the material of the semiconductor wafer 122.

When the processing of the wafer 122 has been completed, the vacuum gate valve 280 is closed and the chamber door 134 is opened by actuation of the air cylinder 136. The vacuum chuck 138 is then extended without rotation by operation of the air cylinder 222. The elevator blade 150 is raised until the groove 156 engages the wafer 122. At this time the vacuum chuck 138 releases the wafer 122 and is retracted into the chamber door 134. The elevator blade 150 lowers the wafer 122 into the same position in the cassette 110 from which it originally came. The elevator blade 150 is moved to its lowered position below the cassette 110, and the cassette 110 is indexed by the cassette conveyor means 126 to the next wafer position. The elevator blade 150 raises the next wafer to the chamber door 134, and the process is repeated as described hereinabove. When each of the wafers 112 in the cassettes 110, 111 has been processed in accordance with this procedure, the cassettes 110, 111 are moved back to the right by the cassette conveyor means 126 for removal by the operator.

In other configurations of the present invention, the programmable control means 144 or the motor 142 can be coupled directly to the shaft of the vacuum chuck 138. Furthermore, alternative programmable control means can be employed. For example, since the speed of the motor 142 is known, the motor 142 can be energized for a predetermined time thereby producing a known rotation of the vacuum chuck 138. It will be understood by those skilled in the art that the vacuum chuck 138 can receive a wafer from any suitable wafer transfer mechanism.

Thus, there is provided by the present invention apparatus for rotating semiconductor wafers into a preselected orientation relative to an ion beam prior to processing. The apparatus is associated with wafer handling means positioned near the entrance to the wafer processing chamber. The apparatus is simple, low cost, accurate and fast acting and is suited for use in an automated wafer transfer system.

While there has been shown and described what is at present considered the preferred embodiments of the invention, it will be obvious to those skilled in the art that various changes and modifications may be made therein without departing from the scope of the invention as defined by the appended claims.

I claim:

1. Apparatus for positioning a semiconductor wafer in a vacuum provessing chamber for processing therein, said apparatus comprising:
   wall means forming a vacuum processing chamber having an opening to receive a wafer for processing;
   processing means in said chamber for processing a wafer at a position inside and aligned with said opening;
   a door and chuck assembly comprising sealing door means for closing said opening and vacuum chuck means for holding a wafer on said assembly;
   means for moving said door and chuck assembly between an open position spaced from the outside of said opening and a closed position in which said door means closes and seals said opening;
   wafer clamping means supported by said chamber wall means adjacent said opening, and spring means resiliently urging said clamping means outwardly with respect to said opening;
   the configuration of said clamping means and said door and chuck assembly being such that when said assembly is in said closed position a wafer held by vacuum on said assembly will be pressed against said clamping means to displace said clamping means against the force of said spring means;
   valve means inside said chamber adjacent said opening, said valve means having a closed position which isolates said opening from the interior of said processing chamber when said door and chuck assembly is in its open position, and said valve means having an open position which permits processing of a wafer when said door and chuck assembly is in its closed position; and
   the arrangement being such that when the airlock formed by the closed valve means and the closed door means is evacuated, the compressive cooperation between said clamping means and said door and chuck assembly prevents a wafer from being dislodged from said door and chuck assembly when the vacuum in the airlock reaches a level which disenables the vacuum of the vacuum chuck means from holding the wafer in position, and said compressive cooperation between said clamping means and said door and chuck assembly remains in effect to hold a wafer during processing thereof.

2. The apparatus as described in claim 1 wherein said door means has cooling passages therein for cooling of a wafer pressed against said door means by said clamping means under the force of said spring means, whereby good thermal contact is maintained between said door means and a wafer thereon when said door means is in said closed position.

3. The apparatus as defined in claim 1 wherein said means for moving said door means between said open and closed positions moves the door means along a straight line path coaxial with said clamping means.

4. The apparatus as defined in claim 1 further comprising cassette means positioned below said opening and adapted to hold wafers in spaced vertical orientation, means for moving said cassette means along a path normal to the plane of said door means, vertically movable lift and lower means for moving wafers individually upward out of and down into said cassette means, and said lift and lower means having an upward position in which a wafer carried thereby is presented to said vacuum chuck means when said door means is in said open position.

5. The apparatus as defined in claim 1 wherein said vacuum chuck means is mounted so as to provide movement of said door means and said vacuum chuck means relative one to the other along a path axially of said door means.

6. The apparatus as defined in claim 1 wherein said door means includes a wafer support surface and said wafer clamping means includes a continuous annular portion having an inside diameter somewhat smaller than the wafer diameter for peripheral clamping of the wafer against the wafer support surface when said door means is in said closed position.

* * * * *